United States Patent [19]
Phillips et al.

[11] Patent Number: 5,274,376

[45] Date of Patent: Dec. 28, 1993

[54] MULTI-MODE DIGITAL TO ANALOG CONVERTER AND METHOD

[75] Inventors: Sabrina D. Phillips, Garland; James R. Hochschild, Plano; William A. Severin, Allen, all of Tex.

[73] Assignee: Texas Instruments Incorporated, Dallas, Tex.

[21] Appl. No.: 861,699

[22] Filed: Apr. 1, 1992

[51] Int. Cl.[5] .............................................. H03M 1/66
[52] U.S. Cl. ..................................... 341/150; 341/144
[58] Field of Search ............... 341/108, 138, 150, 144, 341/172, 155

[56] References Cited

U.S. PATENT DOCUMENTS

| | | | |
|---|---|---|---|
| 4,291,298 | 9/1981 | Carbrey | 341/108 |
| 4,384,277 | 5/1983 | Allgood et al. | 341/150 |
| 4,404,544 | 9/1983 | Dwarakanath | 341/108 |

*Primary Examiner*—A. D. Pellinen
*Assistant Examiner*—Brian K. Young
*Attorney, Agent, or Firm*—Stanton C. Braden; Richard L. Donaldson

[57] ABSTRACT

A multi-mode digital to analog converter for converting a digital input into an analog voltage according to a linear or a companding transfer function. The converter comprises a charge redistribution device for creating an analog voltage at a node and switching circuitry for controlling the charge redistribution device. The switching circuitry is operable to effect either transfer function responsive to its inputs.

7 Claims, 11 Drawing Sheets

MULTI-MODE DIGITAL TO ANALOG CONVERTER AND METHOD

TECHNICAL FIELD OF THE INVENTION

This invention relates in general to the field of electronic systems and more particularly to a multi-mode digital to analog converter and method.

BACKGROUND OF THE INVENTION

Digital to analog converters ("DACs") are electronic devices which generate an analog signal from a digital input. DACs serve to bridge the gap between digital signal processing and analog signal processing equipment in many areas including computer I/0 interfaces, lab test equipment and consumer goods such as compact disc players.

DACs convert their digital input to an analog output according to a mathematic transfer function. Linear, A-law companding and µ-law companding are three popular transfer functions known in the art which are widely accepted. Heretofore, DACs have converted data according to either (1) a linear transfer function, (2) one of the companding functions or (3) either of the companding functions as selected by the user. No known DAC has allowed a user to alternatively convert digital data into an analog output by a linear or by a companding transfer function. At least two devices have been required to perform all three conversion modes.

Therefore, a need has arisen for a DAC which is operable to convert digital data into an analog output by either a linear, A-law companding or µ-law companding transfer function.

SUMMARY OF THE INVENTION

In accordance with the present invention, a digital to analog converter is provided which substantially eliminates or reduces disadvantages and problems associated with prior digital to analog converters.

A multi-mode digital to analog converter is described for converting a digital input into an analog voltage according to a linear or a companding transfer function. The converter comprises a charge redistribution device for creating an analog voltage at a node and switching circuitry for controlling the charge redistribution device. The switching circuitry is operable to effect either transfer function responsive to its inputs.

A first technical advantage of the disclosed invention is its flexibility. A user may transfer digital data into analog data according to any of three transfer functions: linear, A-law companding or µ-law companding.

A second technical advantage of the disclosed invention is its compactness. All three modes of operation are accomplished by a device substantially the same size as prior DACs.

A third technical advantage of the disclosed system is its accuracy. The DAC employs capacitor arrays in a charge redistribution method. Conventional photolithographic techniques are able to produce matched sets of capacitors which increase the accuracy of the resultant output.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 depicts a schematic diagram of the STARRAY block depicted in FIG. 3a;

FIG. 7 depicts a schematic diagram of the STPSW cell depicted in FIG. 3a;

FIG. 13 depicts a schematic diagram of the DASW-CONA block depicted in FIG. 12a;

FIG. 14 depicts a schematic diagram of the DASW-CONB block depicted in FIG. 12a;

FIG. 15 depicts a schematic diagram of the DASW-CONC block depicted in FIG. 12a;

DETAILED DESCRIPTION OF THE INVENTION

The preferred embodiment of the present invention and its advantages are best understood by referring to FIGS. 1 through 17 of the drawings, like numerals being used for like and corresponding parts of the various drawings.

The disclosed invention is described in connection with the following Table of Contents:
I. Mathematical Background
  A. Linear
  B. Companding
    1. A-law companding
    2. µ-law companding
II. DAC Overview
  A. Implementation
  B. Operation
    1. Linear
    2. Companding
      a. A-law companding
      b. µ-law companding
III. Electronic Implementation
  A. Signal description
  B. Analog overview
  C. Digital overview
  D. Step capacitor array
  E. Segment capacitor array
  F. Step switches
  G. Segment switches
  H. Step decoder
    1. Step switch controller 2. Companding controller
I. Segment array decoder
  1. Segment switch controller A
  2. Segment switch controller B
  3. Segment switch controller C
  4. Segment switch controller D
  5. Segment switch controller E

I. MATHEMATICAL BACKGROUND

Figures 1A, 1B, 2:
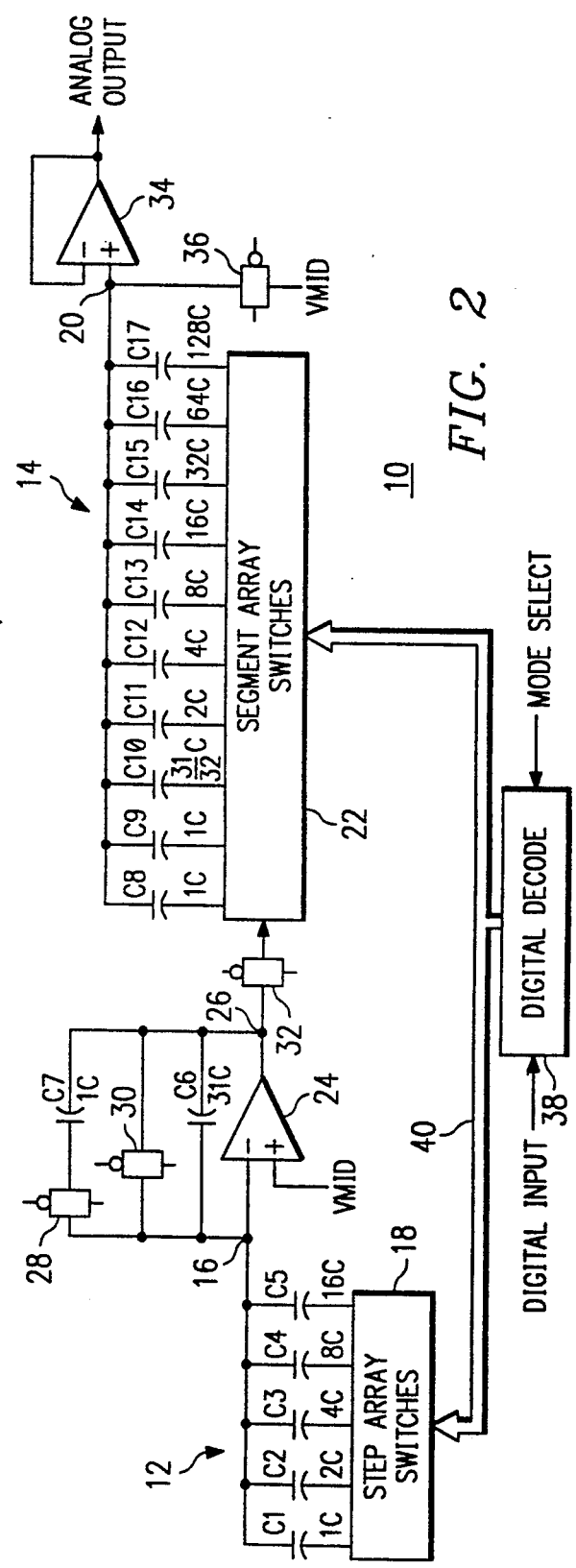
FIGS. 1a and 1b graphically depict a linear and a companding transfer function respectively.
FIG. 2 depicts a high level diagram of the disclosed multi-mode digital to analog converter.

FIGS. 1a and 1b graphically depict a linear and a companding transfer function respectively.

A. Linear

In FIG. 1a, a digital value along the horizontal axis may be related to an analog value along the vertical axis by the simple relationship:

$$|y| = \frac{1}{m} |x/x_{max}|$$

where y is the digital value, x is the analog value, $x_{max}$ is the maximum analog value, and m is the slope of the depicted line. A linear transfer function is appropriate where the expected input values are evenly distributed among all possible choices.

In the illustrated embodiment, the linear data word is thirteen bits long. The first bit is a sign bit indicating whether the analog output is above or below a selected reference value.

B. Companding

Companding ("compressing+expanding") transfer functions are used when accuracy and discrimination around a particular point are more important than linearity. In FIG. 1b, the most important values are those near the origin of the underlying coordinate system. A greater proportion of digital values are allotted to analog values near the origin than to analog values away from the origin. A logarithmic function may be used to describe the depicted curve. For implementation in digital electronics, however, the logarithmic curve is approximated by sixteen linear segments. Each segment is bounded by a dot in the FIGURE. The A-law and $\mu$-law companding transfer functions differ slightly from one another near the origin.

In the illustrated embodiment, the companding data word is eight bits long. The first bit is a sign bit indicating whether the analog output is above or below a selected reference value.

1. A-law Companding

The A-law companding transfer function is given by the relation:

$$|y| = \frac{A|x/x_{max}|}{1 + \log A} \text{ for } 0 \leq |x/x_{max}| \leq 1/A$$

$$|y| = \frac{1 + \log(A|x/x_{max}|)}{1 + \log A} \text{ for } 1/A \leq |x/x_{max}| \leq 1$$

where A=87.6.

2. $\mu$-law Companding

The $\mu$-law companding transfer function is given by the relationship:

$$|y| = \frac{\log(1 + \mu|x/x_{max}|)}{\log(1 + \mu)}$$

where $\mu=255$.

II. DAC OVERVIEW

A. Imclementation

FIG. 2 depicts a high level diagram of the disclosed multi-mode digital to analog converter, indicated generally at 10. DAC 10 comprises a first array of capacitors indicated generally at 12 comprising capacitors C1 through C5. DAC 10 comprises a second array of capacitors indicated generally at 14 comprising capacitors C8 through C17. As depicted, first terminals of each of the capacitors in array 12 are tied together to form a node 16. The second terminal of each capacitor in array 12 is connected to a block 18 labeled STEP ARRAY SWITCHES. First terminals of each of the capacitors in array 14 are tied together to form a node 20. A second terminal of each capacitor in array 14 is connected to a block 22 labeled SEGMENT ARRAY SWITCHES.

Capacitors C1 through C5 and C8 through C17 are manufactured such that their relative capacitances are precisely known. As depicted, capacitors C1 through C5 have a capacitance of 1C, 2C, 4C, 8C and 16C respectively where C is a unit capacitance. Capacitors C8 through C17 have a capacitance of 1C, 1C, (31/32)C, 2C, 4C, 8C, 16C, 32C, 64C and 128C respectively. In the electronic implementation described below, C=0.2 pF.

Node 16 is connected to the inverting input of op-amp 24. The non-inverting input of op-amp 24 is tied to a voltage reference, VMID, while the output is tied to a node 26. Nodes 16 and 26 are connected to each other through 3 parallel circuit paths. The first circuit path comprises switch 28 and capacitor C7 connected in series. The second circuit path comprises a switch 30. The third circuit path comprises a capacitor C6. Capacitors C6 and C7 are also manufactured such that their relative capacitances are precisely known. As depicted, capacitors C6 and C7 have a capacitance of 31C and 1C respectively. Node 26 may be alternately isolated from or connected to SEGMENT ARRAY SWITCHES 22 by a switch 32.

Node 20 is connected to the non-inverting input of op-amp 34. The inverting input to op-amp 34 is tied to the output of op-amp 34. Op-amp 34 acts as a unity gain buffer for the signal ANALOG OUTPUT. Node 20 is coupled to the reference voltage VMID through a switch 36.

STEP ARRAY SWITCHES 18 and SEGMENT ARRAY SWITCHES 22 are controlled by a block 38 labeled DIGITAL DECODE by a control bus 40. STEP ARRAY SWITCHES 18 and SEGMENT ARRAY SWITCHES 22 connect capacitors C1 through C5 and C8 through C17, respectively, to one of a plurality of voltages. STEP ARRAY SWITCHES 18 connect each of capacitors C1 through C5 to one of three reference voltages: DAVRM, VMID, or DAVRP. SEGMENT ARRAY SWITCHES 22 connect capacitors C8 through C17 to one of four voltage levels: DAVRM, VMID, DAVRP, or the voltage at node 26.

DIGITAL DECODE block 38 receives two inputs, DIGITAL INPUT and MODE SELECT. DIGITAL INPUT represents the digital value to be converted into an analog output value by DAC 10. MODE SELECT indicates which of the three transfer functions is to be used by DAC 10 in its conversion of DIGITAL INPUT. DAC 10 may use a linear, A-law companding or $\mu$-law companding transfer function. The operation of DIGITAL DECODE block 38 varies depending upon the mode select input and is described more fully below.

B. Operation

In all modes of operation, DAC 10 operates as a charge redistribution device. In a charge redistribution device an initial charge is placed onto a node by connecting the node to a known reference voltage. Here, nodes 16 and 20 are connected to VMID. The node is then isolated by high impedance devices so that the total charge on the node remains constant during the device's operating time. Here, capacitors C1 through C5, capacitors C8 through C17 and op-amps 24 and 34 maintain the initial charge on nodes 16 and 20.

The initial voltage at the node is varied by selectively connecting a different reference to the second terminal of each capacitor. The potential difference which is generated across the selected capacitors will attract or repel a portion of the initial charge on the node. Whether the potential difference attracts or repels the initial charge depends upon whether the difference between the first and second reference voltages is positive or negative. The change in charge on the terminal of the selected capacitors and on the $V_{out}$:

$$V_{out} = \frac{\sum_i C_i \Delta V_i}{\sum_i C_i}$$

where $C_i$ is the capacitance of the ith capacitor and $\Delta V_i$ is the voltage drop across the ith capacitor caused by the switched reference voltage. This voltage can then be used as an intermediate value (node 16) or as an output (node 20) by buffering the signal through a high input impedance amplifier. Here, op-amps 24 and 34 act as high input impedance amplifiers.

1. Linear

In the linear mode of operation, switches 30 and 36 are momentarily closed to reset all capacitors and nodes 16 and 20 to the reference voltage VMID. Switch 28 is closed causing op-amp 24 to divide the voltage on node by 32 (31+1). DIGITAL DECODE 38 then determines which second reference voltage to use from the value of the sign bit of the input data word. If the sign bit is a logic one, a reference voltage 1.5 V greater than VMID, DAVRP, is applied to selected capacitors of array 14. If the sign bit is a logic zero, a reference voltage 1.5 V less than VMID, DAVRM, is applied to selected capacitors of array 14. The opposite reference voltage than that applied to array 14 is applied to selected capacitors in array 12. The output of array 12 is fed through inverting op amp 24 before being processed by array 14. The output of op-amp 24 is thereby compatible in sign with array 14.

DIGITAL DECODE block 38 switches capacitors C1 through C5 and C8 through C17 to either VMID or the appropriate second reference voltage through STEP ARRAY SWITCHES 18 and SEGMENT ARRAY SWITCHES 22. The voltage at node 26 is always switched to capacitor C8. Capacitors C1 and C10 are always switched to VMID. All other capacitors are uniquely controlled by one input bit of DIGITAL INPUT. Input bits 0 through 3 control capacitors C2 through C5 respectively. Input bits 4 through 11 control capacitors C9, and C11 through C17. (Bit 12 is the sign bit.) The input bits control their respective capacitor by switching the capacitor to VMID when a logic zero and to the appropriate second reference voltage when a logic one.

Capacitors C7 and C6 scale the output of array 12 so that it ranges from (0/32) to (30/32) times the appropriate second reference voltage in steps of (2/32) times the appropriate second reference voltage. These voltages are applied to node 20 through C8. The voltage level passes directly to node 20 because capacitor C8 has a capacitance of 1C.

2. Companding a. A-law Companding

In the A-law companding node, all capacitors and nodes 16 and 34 are initially reset to VMID. The appropriate second reference voltage is then determined from the sign bit by block 38. These operations are more fully described above in connection with the linear mode. Switch 28 remains closed in the A-law mode causing op-amp 24 to scale the voltage at node 16 by 32 (31+1). Capacitor C10 is always tied to VMID while capacitor C1 is always tied to the appropriate second reference voltage according to the sign bit.

Capacitors C2 through C5 are controlled in the A-law companding mode as they are in the linear mode. Input bits 0 through 3 control capacitors C2 through C5. When a particular bit is a logic one, the corresponding capacitor is connected to the appropriate second reference voltage. When the bit is a logic zero, the corresponding capacitor is connected to VMID. Array 12 and op-amp 24 generate 16 voltage levels ranging from (1/32) to (32/32) times the appropriate second reference voltage in steps of (2/32) times the appropriate second reference voltage.

In the A-law companding node, the analog output voltage has a step size (difference between two adjacent digital input values) which increases as the input digital value increases above zero and increases as the input digital value decreases below zero. The exact logarithmic function is simplified to eight linear segments for each of the positive and negative input ranges. If the step size of the first two linear segments above (or below) zero is defined to be two, the step size of the third segment increases to four. Thereafter, the step size doubles for each additional segment. The eighth segment therefore has a step size of 64 times the step size of the first two segments or has a capacitance of 128C.

The A-law companding step size scheme may be implemented by connecting the output of op-amp 24 to a selected one of the capacitors of array 14. The final step size of the output analog voltage will be the product of the output of the op-amp 24 and the selected capacitor. Here the step size of the first two segments is defined to be the voltage change caused by the output of op-amp 24 being connected to a capacitor having a capacitance of 2C. Capacitors C8 and C9 are therefore switched as a single capacitor having a capacitance of 2C.

DIGITAL DECODE block 38 decodes the 3 most significant bits ("MSBS") of the DIGITAL INPUT (excluding sign bit) to determine to which of the eight segments the input value corresponds. Block 38 then switches (1) the output of op-amp 24 to the capacitor corresponding to the selected segment, (2) VMID to all capacitors in array 14 above the selected capacitor (if any) and (3) the appropriate second reference voltage to all capacitors in array 14 below the selected capacitor (if any).

As described above, capacitor C8 and C9 together "correspond" to segment 1, capacitor C11 "corresponds" to segment 2, capacitor 12 "corresponds" to segment 3, etc. A capacitor is "above" another if its designator is greater than the other's designator. A capacitor is "below" another if its designator is less than the other3 s designator (both excluding capacitor C10). For instance, capacitors C14 through C17 are above capacitor C13 and capacitors C8, C9, C11 and C12 are below capacitor C13.

Block 38 decodes the three MSBs, bit 6, bit 5 and bit 4, according to the scheme: 001 designates segment 1, 010 designates segment 2, 011 designates segment 3, ... , and 111 designates segment 8.

$\mu$-law Companding

In the $\mu$-law companding mode, all capacitors and nodes 16 and 34 are initially reset to VMID. The appropriate second reference voltage is then determined from the sign bit by block 38. These operations are more fully described above in connection with the linear mode. Capacitors C8 and C9 are always tied to VMID in this mode.

The operation of DAC 10 in the $\mu$-law companding node is substantially similar to the A-law companding node of operation. The dissimilarities originate from the difference between the two transfer functions near their respective origins. If the step size of the first segment of the $\mu$-law companding transfer function is defined to be "one," the step size of all subsequent segments double. The eighth segment therefore has a step size of 128. In addition, the desired output ranges from (0/31) to (30/31) times the appropriate second reference voltage when the output is within the first segment. In all other segments, the step size within the segment should range from (1/32) to (31/32) times the appropriate second reference voltage.

DIGITAL DECODE block 38 switches the appropriate second reference voltage to capacitors C1 through C5 according to the four least significant bits of the DIGITAL INPUT, respectively. Block 38 also connects node 26 to the capacitor in array 22 according to the 3 MSBs of the input data. These operations are more fully described above in connection with the A-law companding node. If the 3 MSBs equal 000, however, node 26 is connected to capacitor C10. Capacitors C8 and C9 are not used. In addition, if the 3 MSBs indicate that the output is within the first segment, capacitor C1 is connected to VMID and switch 28 is opened to reduce op-amp 24 to a divide-by-31 device. Otherwise, capacitor C1 is connected to the appropriate second reference voltage depending upon the sign bit and switch 28 is closed.

The particular implementation of the $\mu$-law scheme with capacitor C9 having a capacitance of (31/32)C, switch 28 and capacitor C7 allows the generated analog signal to vary between 0 and $\pm V_r$ (8031/8159) as required by the transfer function.

III. ELECTRONIC IMPLEMENTATION

A. Signal Description

The following signals are used by the DAC as described subsequently:

AGCON is the first data line in the four-line control buses B1A(0,3), B1B(0,3), B2(0,3) and C(0,3) through I(0,3). When low, this bit switches VMID to the nth capacitor of the SEGARRAY block.

AU is a digital input to the DAC. It is used in conjunction with LINEAR. When LINEAR is low and AU is high, the DAC converts digital data according to an A-law companding transfer function. When both are low, the DAC converts digital data according to a $\mu$-law companding transfer function.

B1A, B1B, B2, and C through I are the analog voltage levels applied to the bottom plate of capacitors C8 through C17 respectively. They are generated by the SEGSW cells.

B1A(0,3), B1B(0,3), B2(0,3), and C(0,3) through I(0,3) are four-line control buses which drive the SEGSW cells.

B5Q through B9Q are the latched input values corresponding to BIT5 through BIT9.

BIT is a digital input to the nth SSWCON block. It corresponds to the nth least significant bit of the input signal.

BIT5 through BIT9 are particular bits of the digital input. In the LINEAR mode of operation, BIT5 through BIT9 correspond to the eighth through fourth most significant bits, respectively. BIT5 through BIT9 are not used in either companding mode.

DABCON is the fourth data line in the four-line control buses B1A(0,3), B1B(0,3), B2(0,3) and C(0,3) through I(0,3). When high, this bit switches DABUF to the nth capacitor of the SEGARRAY block.

DABUF is the buffered output of the STARRAY block.

DALD is a clock signal generated by FCLK having the same frequency.

DALDBUF is the logic inverse of DALD.

DARF1 and DARF2 are non-overlapping clock signals generated from FCLK in the clock generator block. They have the same frequency as FCLK. These two signals are never high at the same time. DARF2, when high, it initiates a digital to analog conversion.

DASTR is a digital strobe signal indicating that all input bits are on the input bus. It synchronizes DALD, DALDBUF, DARF1, and DARF2 to FCLK.

DAVGND is a reference voltage of 2.5 V.

DAVRM is a low impedance precise negative reference voltage of 1 V (VMID+1.5 V).

DAVRP is a low impedance precise positive reference voltage of 4 V (VMID+1.5 V).

ESAU is a digital signal generated by block SEGDEC. ESAU generates the signal on the third line of the three-line control bus STi(0,2). ESAU controls whether VMID is connected to the first capacitor in the STARRAY block.

FCLK is a filtered master clock signal generated externally.

GCNS is the third line in the three-line control buses ST1(0,2) through ST5(0,2). When low, this bit switches VMID to the nth capacitor in the STARRAY block.

IBIAS1 is an 18 $\mu$A bias current for the Op-Amp in the block STARRAY.

IBIAS2 is a 14 $\mu$A bias Current for the Op-Amp in the block STARRAY.

L1NQ through L4NQ are the logical inverse of L1Q through L4Q, respectively.

L1Q through L4Q are the latched values of LSB1 through LSB4.

LINEAR is a digital input to the DAC. When high, the DAC decodes the digital input according to a linear transfer function. When low, the DAC decodes the digital data by a companded transfer function according to AU.

LSB1 through LSB4 are the four least significant bits of the digital input value.

M1NQ through M3NQ are the logic inverse of M1Q through M3Q, respectively.

M1Q through M3Q correspond to the latched values of MSB1 through M1B3, respectively.

MSB1 through MSB3 are the three most significant bits of the digital input (excluding the sign bit).

NAU is the logic inverse of AU.

NBIT is the logic inverse of BIT.

NCNS is the second line in the three-line control buses ST1(0,2) through ST5(0,2). When low, this bit switches DAVRM to the nth capacitor in the STARRAY block.

NLINEAR is the logic inverse of LINEAR.

NRCON is the third line in the four-line control buses B1A(0,3), B1B(0,3), B2(0,3) and C(0,3) through I(0,3). When low, this bit switches DAVRM to the nth capacitor of the SEGARRAY block.

OADB is a set of digital signals. One signal is input to each segment switch controller. They are generated in the SEGDEC block.

OPIN is a set of digital signals. One signal is input to each segment switch controller other than to DASWCON4. They are generated in the SEGDEC block.

OUTPUT is the analog output of the DAC.

PCNS is the first line in the three-line control buses ST1(0,2) through ST5(0,2). When high, this bit switches DAVRP to the nth capacitor in the STARRAY block.

PRCON is the second line in the four-line control buses B1A(0,3), B1B(0,3), B2(0,3), and C(0,3) through I(0,3). When high, this bit switches DAVRM to the nth capacitor of the SEGARRAY block.

SGN is the sign bit of the digital input.

SGNQ is the inverted latched value of SGN.

SGQ is the latched value of SGN.

ST1 through ST5 are analog voltages applied to the bottom plate of capacitors C1 through C5 respectively. They are generated by the STPSW cells.

ST1(0,2) through ST5(0,2) are three line control buses which drive the STPSW cells.

SWITCHE is a digital signal generated by the SEGDEC block. It alternately divides the output from STARRAY by 31 (low) or 32 (high).

VMID is a low impedance precise mid-reference voltage of 2.5 V.

ZOUT is a digital signal generated by DASWCON2 and DASWCON. It forces the next higher capacitor to switch to VMID in either companding mode.

ZIN is a ZOUT input received by the next higher segment switch controller.

B. Analog Overview

Figure 3A:
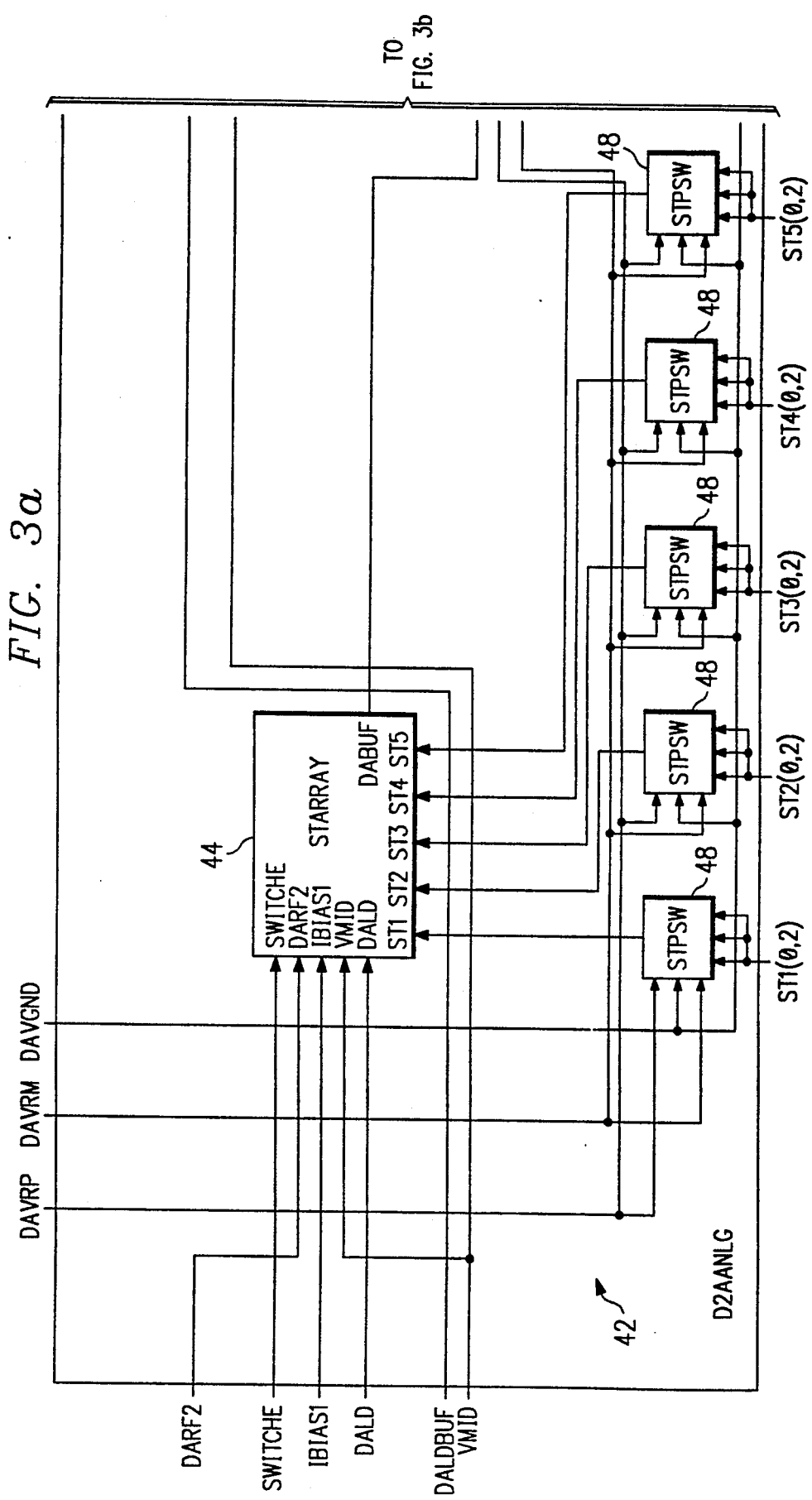
FIGS. 3a and 3b depict a high level diagram of the analog half of the disclosed digital to analog converter.
Figure 3B:
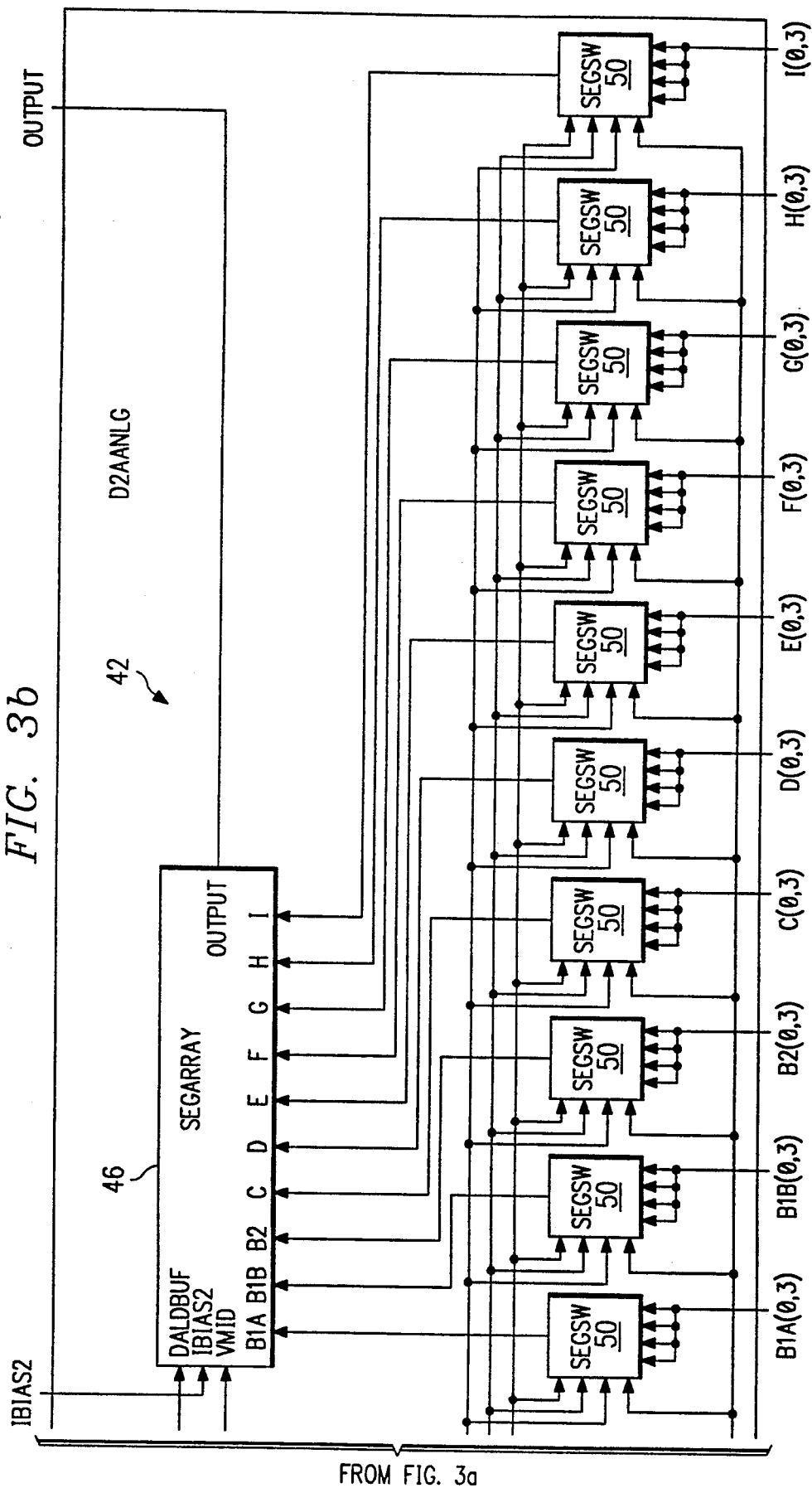

FIGS. 3a and 3b depict a high level diagram of the analog half of the disclosed digital to analog converter indicated generally at 42, labeled D2AANLG. D2AANLG block 42 comprises a step capacitor array block 44, labelled STARRAY, a segment capacitor array block 46, labelled SEGARRAY, five step switch cells 48, labelled STPSW, and ten segment switch cells 50, labelled SEGSW.

STARRAY block 44 generates a buffered analog output, DABUF, corresponding to the four least significant bits of DIGITAL INPUT. STARRAY block 44 has inputs SWITCHE, DARF2, IBIAS1, VMID, DALD, and ST1 through ST5. It is more fully described in connection with FIG. 5.

SEGARRAY block 46 generates OUTPUT, a buffered analog output. SEGARRAY block 46 has inputs DALDBUF, IBIAS2, VMID, B1A, B1B, B2 and C through I. It is more fully described in connection with FIG. 6.

STPSW cell 48 switches one of three reference voltages to a particular capacitor in STARRAY block 44 through ST1 through ST5. The particular capacitor which STPSW controls depends upon the particular connection of STPSW cell 48 to STARRAY block 44. Each STPSW cell 48 has a single output ST1, ST2, ST3, ST4 or ST5. Each cell also has inputs DAVRP, DAVRM, DAVGND and one three-line control bus, either ST1(0,2), ST2(0,2), ST3(0,2), ST4(0,2) or ST5(0,2). STPSW cell 48 is more fully described in connection with FIG. 7.

SEGSW cell 50 switches a particular capacitor in SEGARRAY block 46 to one of four voltage levels through B1A, B1B, B2, and C through I. Each SEGSW cell 50 has a single output, either B1A, B1B, B2, C, D, E, F, G, H or I. Each cell also has inputs DABUF, DAVRP, DAVRM, DAVGND and one of the four-line control buses, B1A(0,3), B1B(0,3), B2(0,3), C(0,3), D(0,3), E(0,3), F(0,3), G(0,3), H(0,3) or I(0,3). SEGSW cell 50 is more fully described in connection with FIG. 8.

C. Digital Overview

Figure 4:
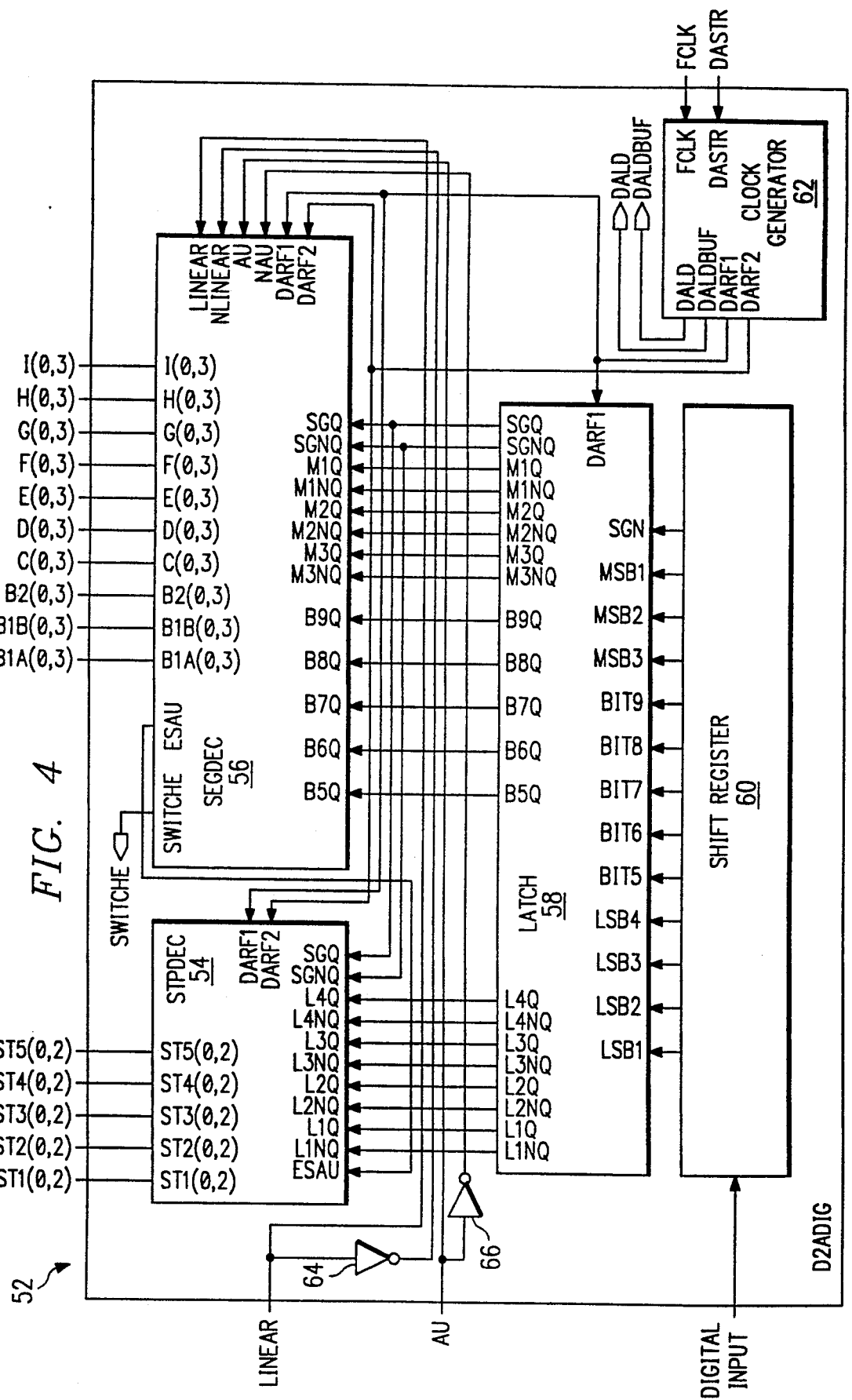
FIG. 4 depicts a high level diagram of the digital half of the disclosed digital to analog converter.

FIG. 4 depicts a high level diagram of the digital half of the disclosed digital to analog converter indicated generally at 52 labelled D2ADIG. D2ADIG block 52 comprises a step decoder block 54 labelled STPDEC, a segment array decoder 56, labelled SEGDEC, a latch 58, a shift register 60 and a clock generator 62. D2ADIG block 52 generates the control buses ST1(0,2) through ST5(0,2) and B1A(0,3), B1B(0,3), B2(0,3), and C(0,3) through I(0,3). It has as inputs, LINEAR, AU, DIGITAL INPUT, FCLK and DASTR. In addition, D2ADIG block 52 comprises inverters 64 and 66 which generate the digital signals NLINEAR and NAU from LINEAR and AU, respectively.

STPDEC block 54 generates the five three-line control buses ST1(0,2) through ST5(0,2). It has inputs DARF1, DARF2, ESAU, L1NQ through L4NQ, L1Q through L4Q, SGNQ, and SGQ. It is more fully described in connection with FIG. 9.

SEGDEC block 56 generates the ten four-line control buses B1A(0,3), B1B(0,3), B2(0,3), C(0,3) through I(0,3) and the digital control signals SWITCHE and ESAU. It has inputs, LINEAR, NLINEAR, AU, NAU, DARF1, DARF2, SGQ, SGNQ, M1Q through M3Q, M1NQ through M3NQ and B5Q through B9Q. It is more fully described in connection with FIGS. 12a and 12b.

Latch 58 is a 13×1 bit latch triggered by DARF1. Latch 58 generates the latched signals L1Q through L4Q from LSB1 through LSB4 respectively. Latch 58 generates the respective inverses of these Samp signals, LINQ through L4NQ. Latch 58 generates the latched signals SGQ, M1Q, M2Q, M1Q AND B5Q through B9Q from SGN, MSB1, MSB2, MSB3, and BIT5 through BIT9. Latch 58 also generates SGNQ, M1NQ, M2NQ and M3NQ. These are the logic inverses of the signals SGQ, M1Q, M2Q and M3Q.

Shift register 60 receives a digital input, typically serially, and generates the 13 output bits, SGN, MSB1, MSB2, MSB3, BIT5 through BIT9 and LSB4 through LSB1 depending upon the mode of operation. In the linear mode, shift register 60 outputs 13 serially input data bits such that $bit_0 = LSB1$, $bit_1 = LSB2$, $bit_2 = LSB3$, $bit_3 = LSB4$, $bit_4 = BIT5 \ldots$, $bit_{10} = MSB2$, $bit_{11} \times MSB1$, and $bit_{12} = SGN$. In either companding mode, $bit_0$ through $bit_3$ are switched to LSB1 through LSB4 respectively. Bit9 through bit12 are switched to MSB3, MSB2, MSB1 and SGN respectively.

Clock generator 62 generates the four clock signals DALD, DALDBUF, DARF1 and DARF2 from the inputs FCLK and DASTR. All four output clocks have the same operating frequency as FCLK and are synchronized by DASTR.

D. Step Capacitor Array

Figure 5:
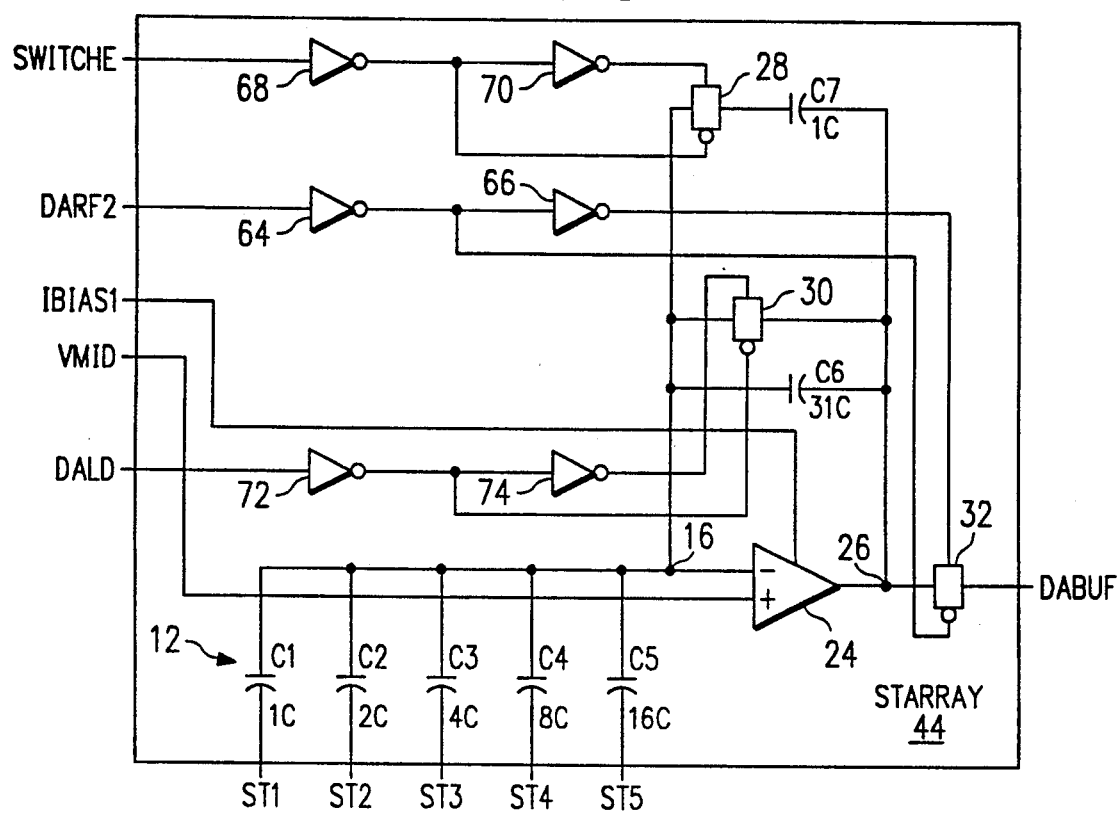

FIG. 5 depicts a schematic diagram of the STARRAY block 44 depicted in FIG. 3a. STARRAY block 44 comprises a high input impedance op-amp 24. The non-inverting input to op-amp 24 is connected to the reference voltage VMID. The inverting input of op-amp 24 is connected to node 16. The output of op-amp 24 is connected to node 26. Op-amp 24 is biased by the input IBIAS1. Node 16 is connected to the first terminal of each of five capacitors, C1 through C5. The second terminal of each of capacitors C1 through C5 are connected to the input signals ST1 through ST5. Capacitors C1 through C5 have capacitances 1C, 2C, 4C, 8C, and 16C respectively. Node 26 generates the output signal DABUF after passing through CMOS switch 32. CMOS switch 32 is controlled by the signal DARF2 after being inverted by inverters 64 and 66 as depicted.

Three parallel circuit paths connect nodes 16 and 26. The first circuit path connects node 16 to 26 through CMOS switch 28 and capacitor C7. CMOS switch 28 is driven by the input SWITCHE after being inverted by inverters 68 and 70 as depicted. Capacitor C7 has a capacitance of 1C. The second current path connects node 16 to node 26 through CMOS switch 30. CMOS switch 30 is controlled by the input signal DALD after being inverted by inverters 72 and 74. The third current path connects node 16 to node 26 through capacitor C6. Capacitor C6 has a capacitance of 31C.

In the depicted embodiment, $C = 0.2$ pF.

E. Segment Capacitor Array

Figure 6:
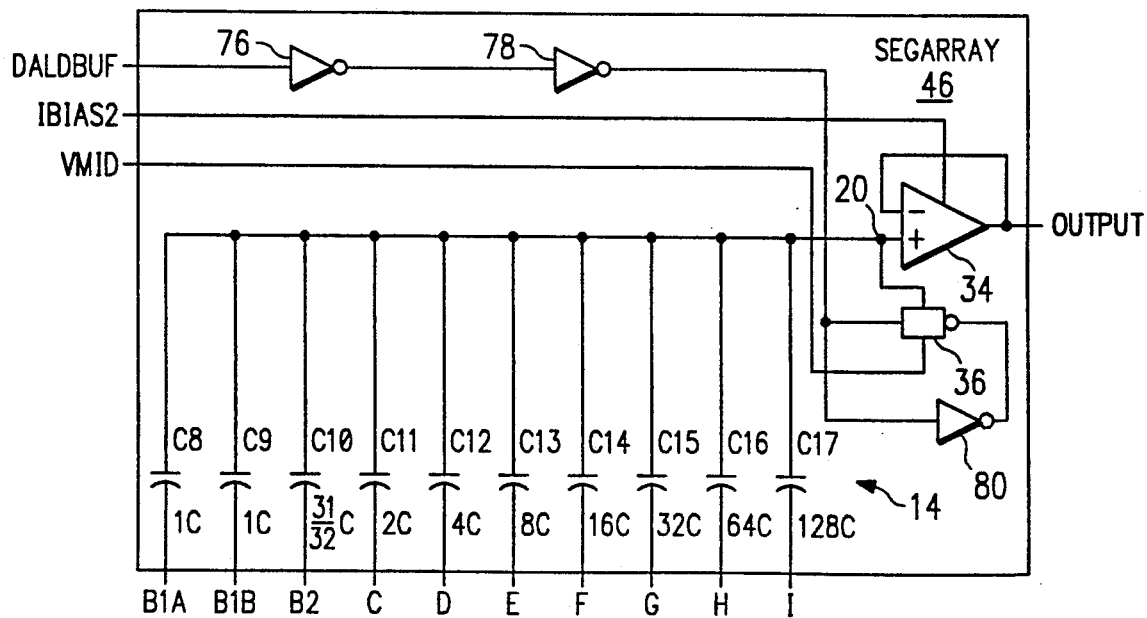
FIG. 6 depicts schematically the SEGARRAY block depicted in FIG. 3b.

FIG. 6 depicts schematically the SEGARRAY block 46 depicted in FIG. 3b. SEGARRAY block 46 comprises a high input impedance op-amp 34. Op-amp 34 has its inverting input tied to its output thereby acting as a unity gain buffer for its non-inverting input. The output of op-amp buffer 34 generates the signal OUTPUT. The non-inverting input of op amp 34 is connected to node 20. Op-amp 34 is biased by the input signal IBIAS2.

Node 20 is connected to the first terminal of each of capacitors C8 through C17. The second terminal of each of capacitor C8 through C17 is connected to one of the input signals B1A, B1B, B2, and C through I, respectively. Capacitors C8 through C17 have a capacitance of 1C, 1C, (31/32)C, 2C, 4C, 8C, 16C, 32C, 64C and 128C, respectively. Node 20 is also connected to VMID through CMOS switch 36. CMOS switch 36 is controlled by the input signal DALDBUF after being inverted by inverters 76, 78 and 80.

F. Step Switches

Figure 7:
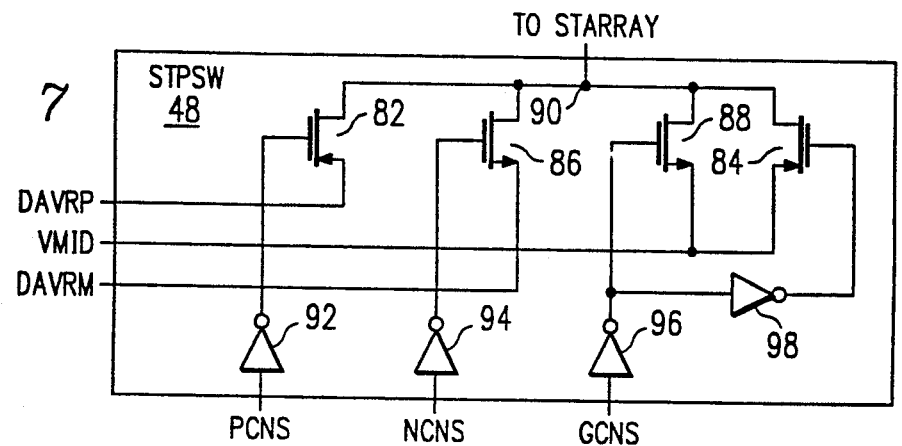

FIG. 7 depicts a schematic diagram of the STPSW cell 48 depicted in FIG. 3a. STPSW cell 48 comprises p-channel transistors 82 and 84 and n-channel transistors 86 and 88. The drains of transistors 82 through 88 are connected to a node 90. Node 90 acts as the output of STPSW cell 48 and generates one of the signals ST1 through ST5.

The gate to transistor 82 is connected to the input PCNS through an inverter 92. The source of transistor 82 is connected to the reference voltage DAVRP. The gate of transistor 86 is connected to the input NCNS through an inverter 94. The source of transistor 86 is connected to the reference voltage DAVRM. The gate of transistor 88 is connected to the input GCNS through on inverter 96. The gate of transistor 84 is connected to the input GCNS through an inverter 96 and an inverter 98. The sources of transistors 88 and 84 are connected to the reference voltage VMID.

The inputs to STPSW cell 48, PCNS, NCNS and GCNS form one of the three-line control buses STI(0,2) through ST5(0,2). The output of STPSW cell 48 through node 90 forms one of the control signals ST1 through ST5. The particular control bus and control line is determined by the position of STPSW cell 48 in FIG. 3a.

G. Segment Switches

Figure 8:
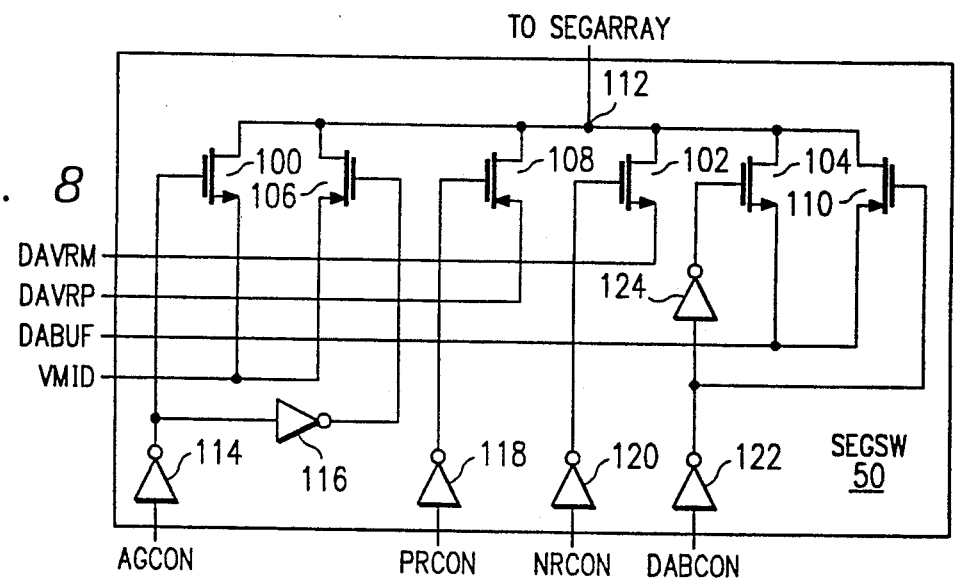
FIG. 8 depicts a schematic diagram of the SEGSW cell depicted in FIG. 3b.

FIG. 8 depicts a schematic diagram of the SEGSW cell 50 depicted in FIG. 3b. SEGSW cell 50 comprises n-channel transistors 100, 102 and 104 and p-channel transistors 106, 108 and 110. The drains of transistors 100 through 110 are connected to a node 112. Node 112 acts as the output of SEGSW cell 50. The gate of transistor 100 is connected to the input AGCON through an inverter 114. The gate to transistor 106 is connected to the input AGCON through an inverter 116 and inverter 114. The sources of transistors 100 and 106 are connected to an input reference voltage VMID. The gate of transistor 108 is connected to the input PRCON through an inverter 118. The source of transistor 108 is tied to a reference voltage DAVRP. The gate of transistor 102 is connected to the input NRCON through an inverter 120. The source of transistor 102 is connected to a reference voltage, DAVRM. The gate of transistor 104 is connected to the input signal DABCON through an inverter 122 and an inverter 124. The gate of transistor 110 is connected to the input signal DABCON through inverter 122. The sources of transistors 104 and 110 are connected to reference voltage DABUF.

The inputs to SEGSW cell 50, AGCON, PRCON, NRCON and DABCON form one of the ten four-line control buses B1A(0,3), B1B(0,3), B2(0,3), C(0,3), D(0,3), E(0,3), F(0,3), G(0,3), H(0,3) or I(0,3). The output of SEGSW cell 50 forms one of the control signals B1A, B1B, B2, C, D, E, F, G, H or I. The particular control bus and control line is determined by the position of SEGSW cell 50 in FIG. 3b.

H. Step Decoder

Figure 9:
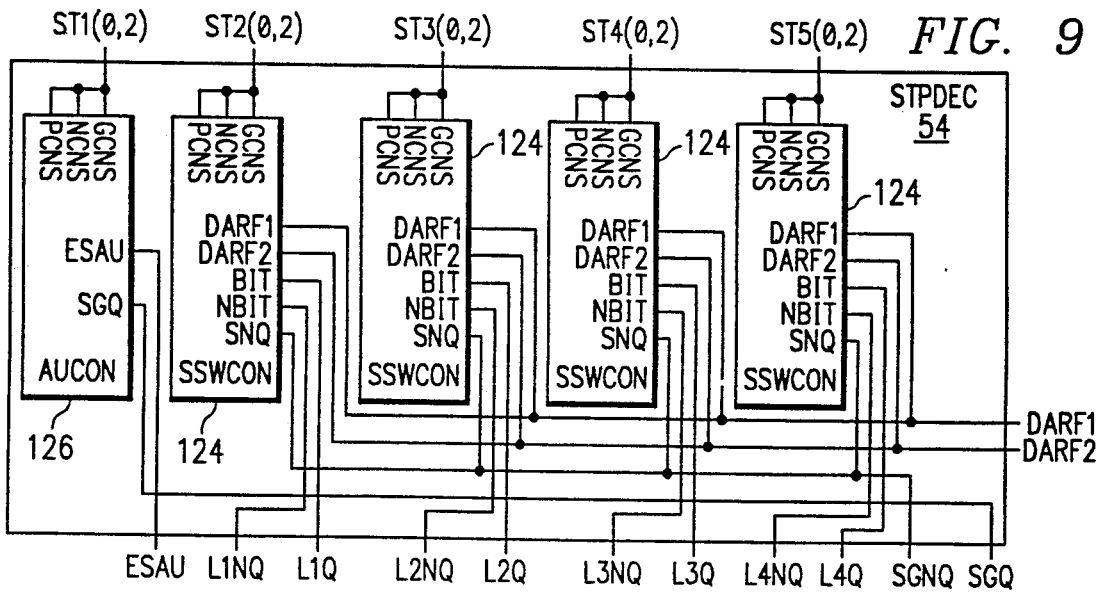
FIG. 9 depicts a block diagram of the STPDEC block depicted in FIG. 4.

FIG. 9 depicts a block diagram of the STPDEC block 54 depicted in FIG. 4. STPDEC block 54 generates the five three-line control buses ST1(0,2) through ST5(0,2). STPDEC block 54 has inputs ESAU, L1NQ through L4NQ, L1Q through L4Q, SGNQ, SGQ, DARF1 and DARF2. STPDEC block 54 comprises four step switch controller cells 124 labeled SSWCON and a single companding controller 126 labelled AUCON.

Each SSWCON cell 124 generates one Of the four three-line control buses ST2(0,2) through ST5(0,2). Each has inputs DARF1, DARF2, SNQ and a BIT and NBIT corresponding to one of L1Q through L4Q and one of L1NQ through L4NQ, respectively. The particular input to BIT and NBIT and the particular output control bus is determined by the position of SSWCON cell 124 in STPDEC block 54. SSWCON cell 124 is further described in connection with FIG. 10.

AUCON block 126 generates the three-line control bus STI(0,2). It has inputs, ESAU and SGQ. AUCON block 126 is further described in connection with FIGURE 11.

1. Step switch controller

Figure 10:
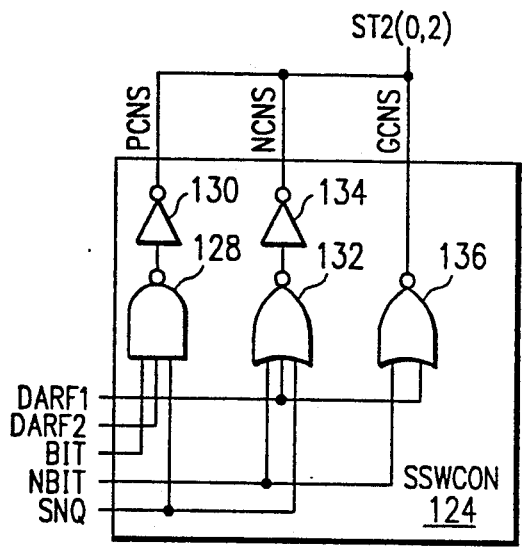
FIG. 10 depicts a schematic diagram of the SSWCON cell depicted in FIG. 9.

FIG. 10 depicts a schematic diagram of the SSWCON cell 124 depicted in FIG. 4. The control signal PCNS is generated from the output of a three-input NAND gate 128 inverted by an inverter 130. Gate 128 has as its inputs BIT, DARF2 and SNQ. The control signal NCNS is generated by a three-input NOR gate 132 inverted by an inverter 134. Gate 132 has as its inputs NBIT DARF1 and SNQ. The control signal GCNS is generated by the output of a NOR gate 136. Gate 136 has as its inputs NBIT and DARF1. The particular values of BIT and NBIT and the connection of the output signals PCNS, NCNS and GCNS to a particular control bus depends upon the position of SSWCON cell 124 in STPDEC block 54.

2. Companding controller

Figure 11:
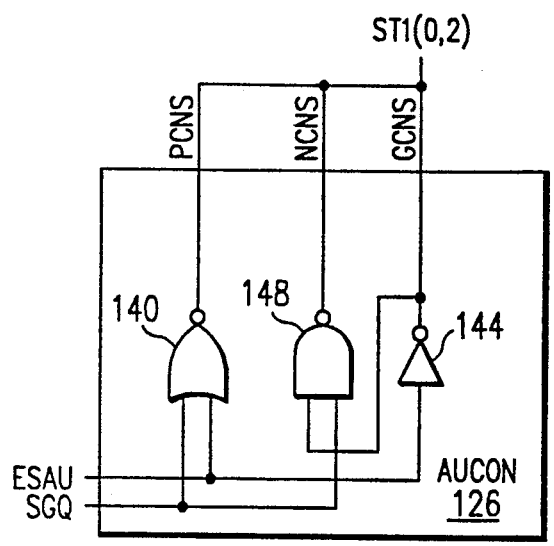
FIG. 11 depicts a schematic diagram of the AUCON block depicted in FIG. 9.

FIG. 11 depicts a schematic diagram of the AUCON block 126 depicted in FIG. 9. The output PCNS is generated by the output of a NOR gate 140. Gate 140 has as its inputs, ESAU and SQ. The output GCNS is generated by the input ESAU inverted by an inverter 144. The output NCNS is generated by the output of a NAND gate. Gate 148 has as its inputs, SGQ and GCNS. The control signals PCNS, NCNS and GCNS form the three-line control bus ST1(0,2).

I. Segment Array Decoder

Figure 12A:
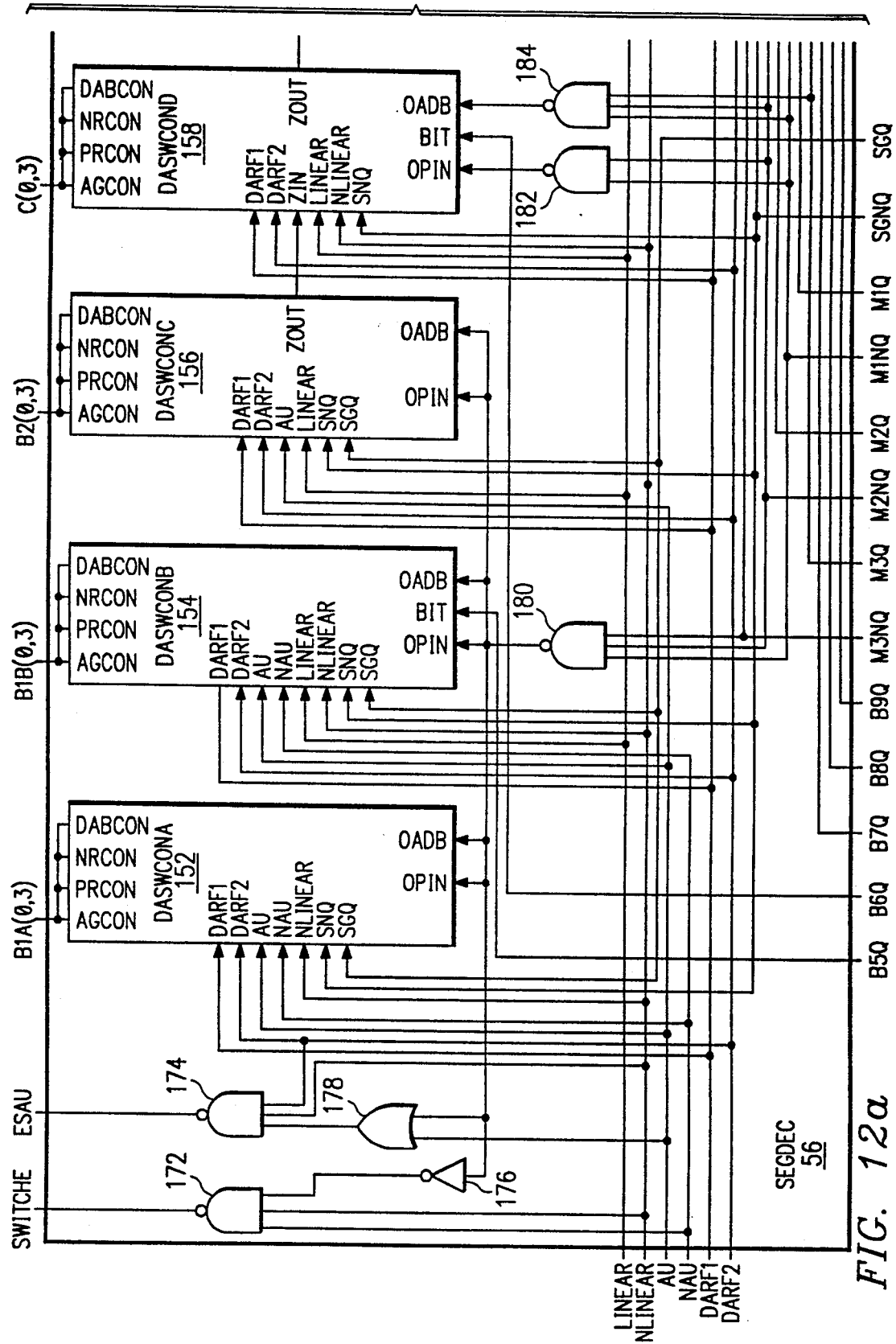
FIGS. 12a and 12b depict a high level diagram of the SEGDEC block depicted in FIG. 4.
Figure 12B:
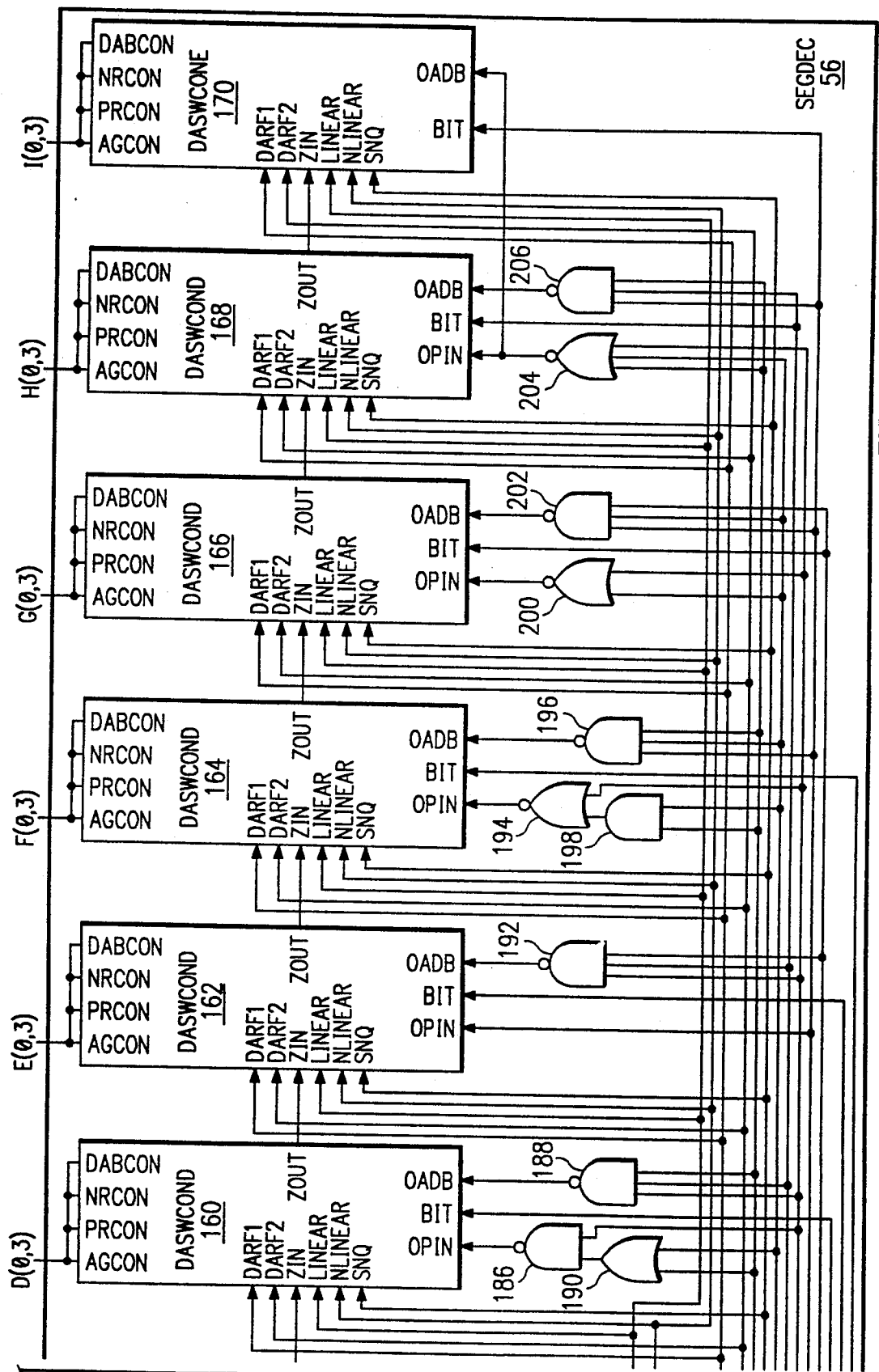

FIGS. 12a and 12b depict a high level diagram of the SEGDEC block 56 depicted in FIG. 4. SEGDEC block 56 generates the four-line control buses B1A(0,3), B1B(0,3), B2(0,3), and C(0,3) through I(0,3) and the signals SWITCHE and ESAU. SEGDEC block 56 has inputs LINEAR, NLINEAR, AU, NAU, DARF1, DARF2, SGQ, SGNQ, M1Q through M3Q, M1NQ through M3NQ and B5Q through B9Q. SEGDEC block 56 comprises a segment switch controller A block 152 labelled DASWCONA, a segment switch controller B block 154 labelled DASWCONB, a segment switch controller C block 156 labelled DASWCONC, 6 segment switch controller blocks 158 through 168 labelled DASWCOND and a segment switch controller E block 170 labelled DASWCONE.

The signals SWITCHE and ESAU are generated from the outputs of three-input NAND gates 172 and 174, respectively. Gate 172 has inputs NAU, NLINEAR, and the output of an inverter 176. Gate 174 has inputs, the output of an OR gate 178, NLINEAR and DARF2. Gate 178 has inputs AU and the output of a three-input NAND gate 180. The output of gate 180 is also connected to the input of inverter 176. NAND gate 180 has inputs M1NQ, M2NQ, and M3NQ.

DASWCONA block 152 generates the four-line control bus B1A(0,3). It has inputs DARF1, DARF2, AU, NAU, NLINEAR, SNQ, SGQ, OPIN and OADB. OPIN and OADB are connected to the output of gate 180. DASWCONA block 152 is further described in connection with FIG. 13.

DASWCONB block 154 generates the four-line control bus B1B(0,3). It has inputs DARF1, DARF2, AU, NAU, LINEAR, NLINEAR, SNQ, SGQ, OPIN, BIT and OADB. OPIN and OADB are connected to the output of gate 180. The input BIT is connected to B5Q. DASWCONB block 154 is further described in connection with FIG. 14.

DASWCONC block 156 generates the four-line control bus B2(0,3). It has inputs DARF1, DARF2, AU, LINEAR, SNQ, SGQ, OPIN and OADB. OPIN and OADB are connected to the output of gate 180. In addition, the output signal ZOUT is connected to the input ZIN of DASWCONC cell 158. DASWCONC block 156 is further described in connection with FIG. 15.

DASWCOND cells 158 through 168 generate the four-line control buses C(0,3) through H(0,3). Each cell has inputs DARF1, DARF2, ZIN, LINEAR, NLINEAR, SNQ, OPIN, BIT and OADB. In addition, each cell generates ZOUT which is fed to the adjacent cell as depicted. DASWCOND cells 158 through 168 are further described immediately below and in connection with FIG. 16.

In DASWCOND cell 158, the input BIT is connected to B6Q. The inputs OPIN and OADB are generated by the outputs of a two-input NAND gate 182 and a three-input NAND gate 184, respectively. Gate 182 has inputs M1NQ and M2NQ. Gate 184 has inputs M1NQ, M2NQ and M3Q.

In DASWCOND cell 160, the input BIT is connected to B7Q. The inputs OPIN and OADB are generated by the output of a two-input NAND gate 186 and a three-input NAND gate 188, respectively. Gate 186 has inputs M1NQ and the output of an OR gate 190. Gate 190 has inputs M3NQ and M2NQ. Gate 188 has inputs M1NQ, M2Q and M3Q.

In DASWCOND cell 162, the inputs OPIN and BIT are connected to M1Q and B8Q, respectively. The input signal OADB is generated from the output of a three-input NAND gate 192. NAND gate 192 has inputs M1NQ, M2Q and M3Q.

In DASWCOND cell 164, the input BIT is connected to B9Q. The input signals OPIN and OADB are generated from the output of a NOR gate 194 and from the output of a three-input NAND gate 196, respectively. Gate 194 has inputs M1Q and the output of an AND gate 198. Gate 198 has inputs M3NQ and M2NQ. Gate 196 has inputs M1Q, M2NQ and M3NQ.

In DASWCOND cell 166, the input BIT is connected to M3Q. The inputs OPIN and OADB are generated from the outputs of a NOR gate 200 and a three input NAND gate 202. Gate 200 has inputs M2NQ and M1NQ. Gate 202 has inputs M1Q, M2NQ and M3Q.

In DASWCOND cell 168 the input BIT is connected to M2Q. The inputs OPIN and OADB are generated from the outputs of a NOR gate 204 and from the output of a three-input NAND gate 206. Gate 204 has as its inputs M3NQ, M2NQ and M1NQ. Gate 206 has inputs M1Q, M2Q and M3NQ.

DASWCONE block 170 generates the four-line control bus I(0,3). The cell has inputs DARF1, DARF2, ZIN, LINEAR, NLINEAR, SNQ, BIT and OADB. The input signals BIT and OADB are connected to M1Q and to the output of gate 204, respectively. DASWCONE block 170 is further described in connection with FIG. 17.

1. Segment switch controller A

Figure 13:
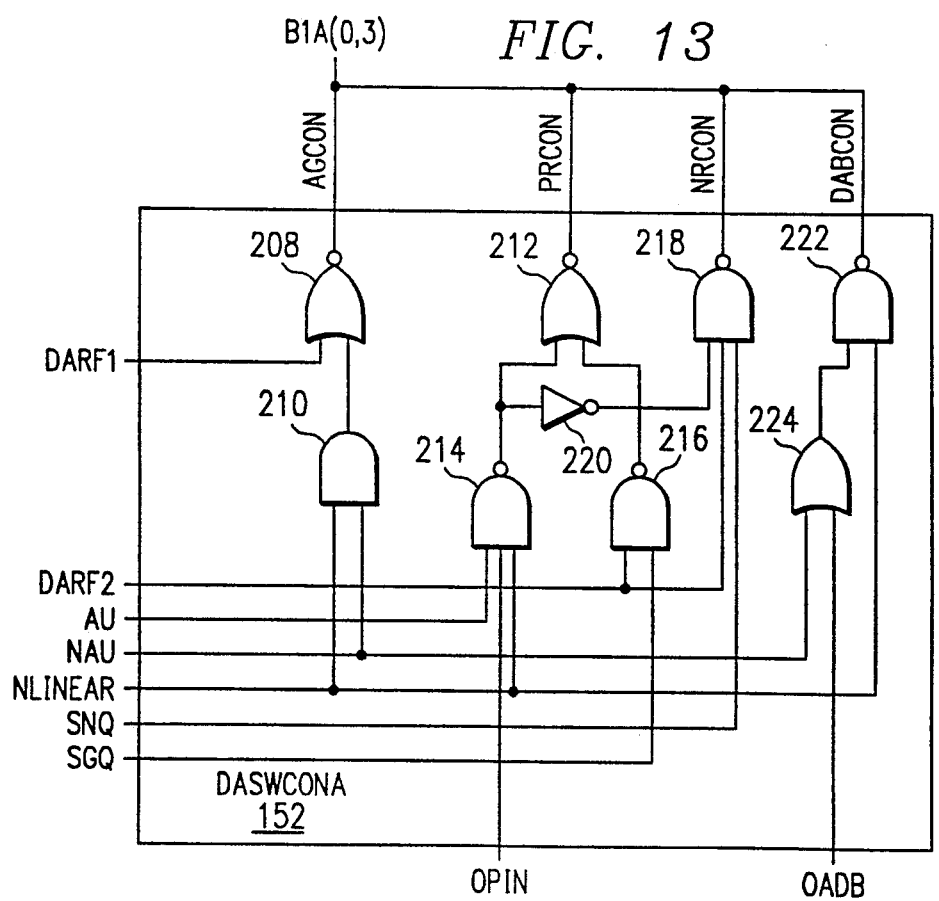

FIG. 13 depicts a schematic diagram of the DASWCONA block 152 depicted in FIG. 12. The output AGCON is generated by the output of an NOR gate 208. Gate 208 has inputs DARF1 and the output from an AND gate 210. Gate 210 has inputs NLINEAR and NAU.

The output PRCON is generated by the output of a NOR gate 212. Gate 212 has as its inputs the output of a three-input NAND gate 214 and a two-input NAND gate 216. NAND gate 214 has inputs, AU, OPIN and NLINEAR. Gate 216 has inputs DARF2 and SGQ.

The output NRCON is generated by the output of a three input NAND gate 218. Gate 218 has inputs DARF2, SNQ and the output of gate 214 inverted by an inverter 220.

The output DABCON is generated by the output of a NAND gate 222. Gate 222 has inputs NLINEAR and the output of an OR gate 224. Gate 224 has inputs NAU and OADB.

2. Segment switch controller B

Figure 14:
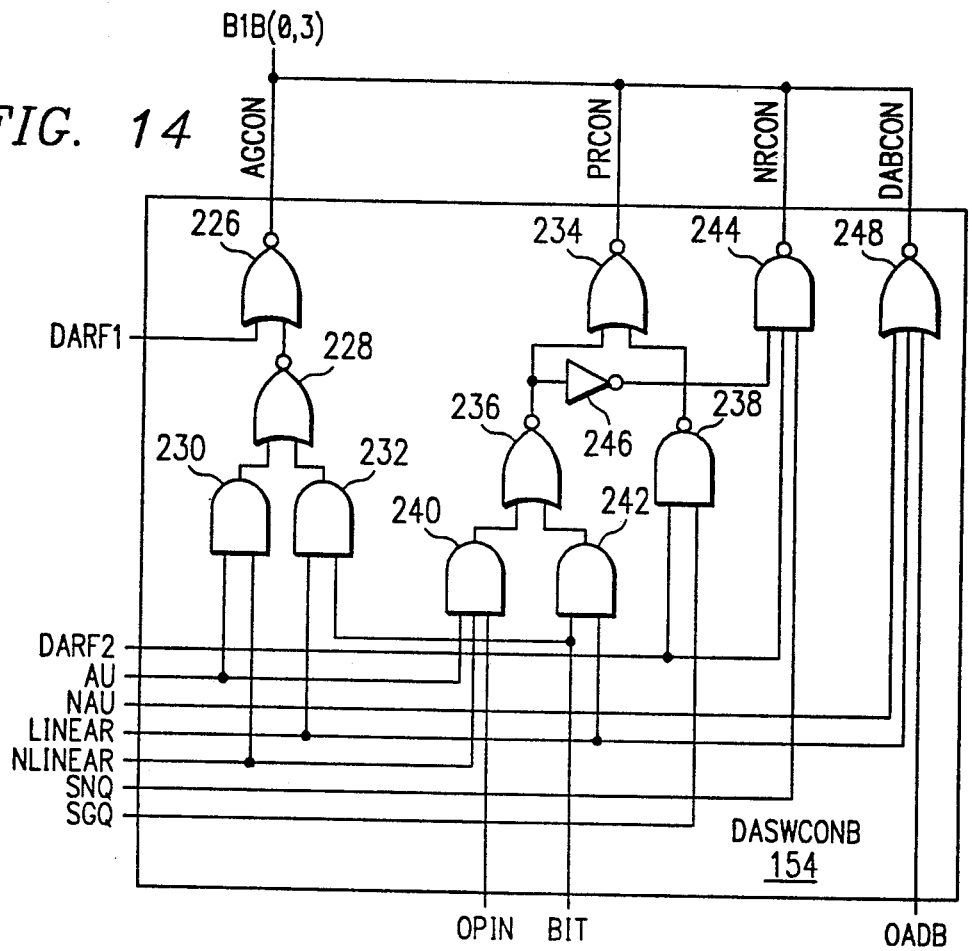

FIG. 14 depicts a schematic diagram of the DASW-CONB block 154 depicted in FIG. 12. The output AGCON is generated by the output of an NOR gate 226. NOR gate 226 has as its inputs DARF1 and the output from a NOR gate 228. Gate 228 has as its inputs the outputs from an AND gate 230 and an AND gate 232. Gate 230 has inputs AU and NLINEAR. Gate 232 has inputs LINEAR and BIT.

The output PRCON is generated by the output of a NOR gate 234. Gate 234 has as its inputs the outputs of a NOR gate 236 and a NAND gate 238. Gate 236 has as its inputs the outputs from a three-input AND gate 240 and an AND gate 242. Gate 240 has inputs AU, NLINEAR and OPIN. Gate 242 has as its inputs BIT and LINEAR. Gate 238 has as its inputs DARF2 and SGQ.

The output NRCON is generated by the output of a three input NAND gate 244. Gate 244 has inputs, DARF2, SNQ and the output of gate 236 inverted by an inverter 246.

The output DABCON is generated by the output of a three-input NOR gate 248. Gate 248 has inputs, NAU, LINEAR and OADB.

3. Segment switch controller C

Figure 15:
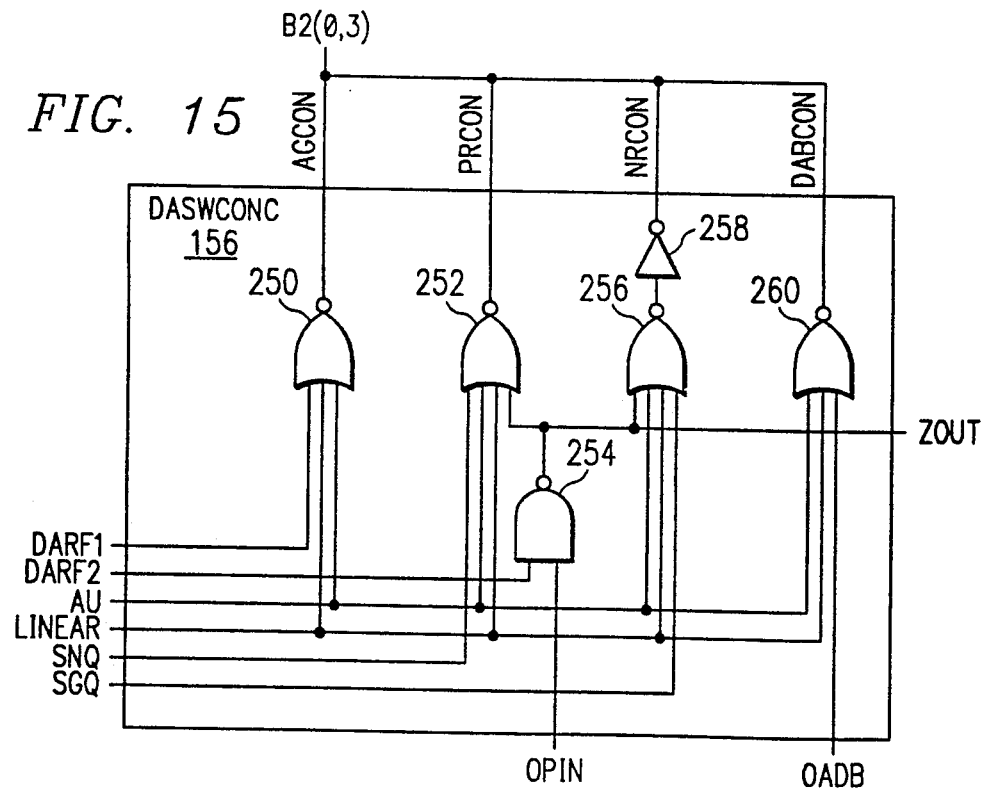

FIG. 15 depicts a schematic diagram of the DASW-CONC block 156 depicted in FIG. 12. The output AGCON is generated by the output of a three-input NOR gate 250. Gate 250 has inputs, DARF1, LINEAR and AU.

The output PRCON is generated by the output of a four-input NOR gate 252. Gate 252 has inputs SNQ, AU, LINEAR and the output from a NAND gate 254. Gate 254 has inputs DARF2 and OPIN.

The output NRCON is generated by the output of a four-input NOR gate 256 inverted by an inverter 258. Gate 256 has inputs, AU, LINEAR, SGQ and the output of gate 254.

The output DABCON is generated by the output of a three-input NOR gate 260. Gate 260 has inputs AU, LINEAR and OADB. The internal signal ZOUT is generated by the output of gate 254.

4. Segment switch controller D

Figure 16:
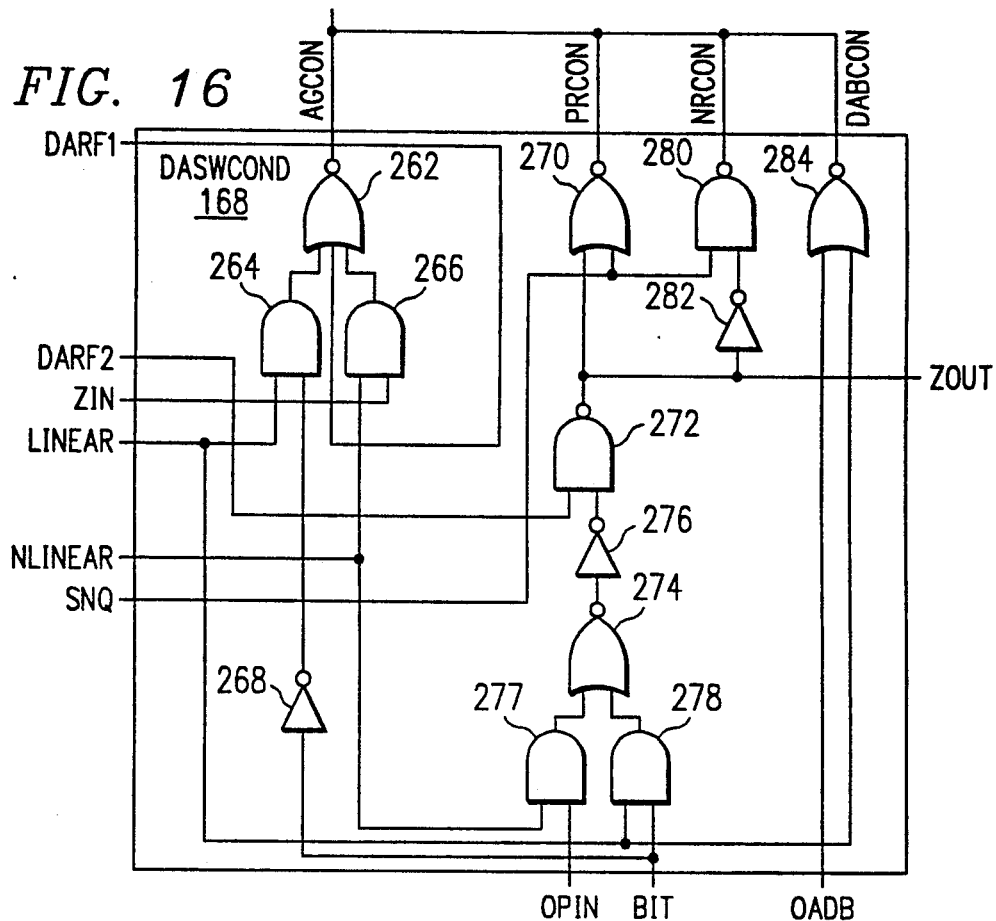
FIG. 16 depicts a schematic diagram of the DASW-COND cell depicted in FIGS. 12a and 12b.

FIG. 16 depicts a schematic diagram of the DASW-COND cell depicted in FIG. 12. The output AGCON is generated by the output of a three-input NOR gate 262. Gate 262 has inputs, DARF1, the output of an AND gate 264, and the output of an AND gate 266. Gate 264 has inputs, LINEAR and BIT inverted by an inverter 268. Gate 266 has inputs, NLINEAR and ZIN.

The output PRCON is generated by the output of a NOR gate 270. Gate 270 has inputs, SNQ and the output of a NAND gate 272. Gate 272 has inputs DARF2 and the output of a NOR gate 274 inverted by an inverter 276. Gate 274 has as its inputs the output from a first AND gate 277 and a second AND gate 278. Gate 277 has inputs, NLINEAR and OPIN. Gate 278 has inputs, LINEAR and BIT.

The output NRCON is generated by the output of a NAND gate 280. Gate 280 has inputs SNQ and the output of gate 272 inverted by an inverter 282.

The output DABCON is generated by the output of a NOR gate 284. Gate 284 has inputs OADB and LINEAR.

The internal signal ZOUT is generated by the output of gate 272.

5. Segment switch controller E

Figure 17:
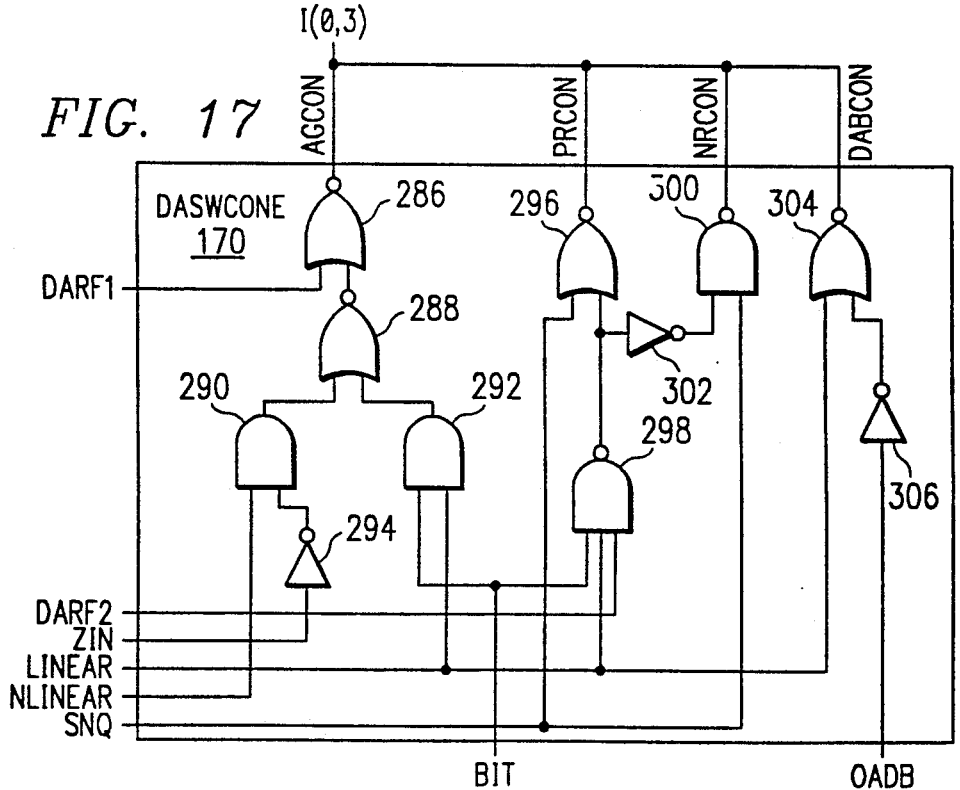
FIG. 17 depicts a schematic diagram of the DASW-CONE block depicted in FIG. 12b.

FIG. 17 depicts a schematic diagram of the DASW-CONE block 170 depicted in FIG. 12. The output AGCON is generated by the output of a NOR gate 286. Gate 286 has inputs, DARF1 and the output of a NOR gate 288. Gate 288 has inputs the outputs from two AND gates 290 and 292. Gate 290 has inputs, NLINEAR and ZIN inverted by an inverter 294. Gate 292 has inputs, BIT and LINEAR.

The output PRCON is generated by the output of a NOR gate 296. Gate 296 has inputs, SNQ and the output from a three-input NAND gate 298. Gate 298 has inputs BIT, LINEAR and DARF2.

The output NRCON is generated by the output of a NAND gate 300. Gate 300 has inputs, SNQ and the output of gate 298 inverted by an inverter 302.

The output DABCON is generated by the output of a NOR gate 304. Gate 304 has inputs, LINEAR and OADB inverted by an inverter 306.

Although the present invention and its advantages have been described in detail, it should be understood that various changes, substitutions and alterations can be made herein without departing from the spirit and scope of the invention as defined by the appended claims.

What is claimed is:

1. A multi-mode digital to analog convertor, comprising:
   a first capacitor array for generating a first voltage at a first node, each capacitor in the array having a first and second terminal, each of the first terminals coupled to the first node;
   a second capacitor array for generating a second voltage at a second node, each capacitor in the second array having a first and second terminal, each of the first terminals of the second capacitor array coupled to the second node; and
   switching circuitry coupled to the first and second array, the circuitry operable to control the first and second arrays for converting a digital input to an analog output according to a linear transfer function upon the switching circuitry receiving a first input control signal, the circuitry operable to control the first and second arrays for converting the digital input to an analog output according to a companding transfer function responsive to receiving a second input control signal.

2. The converter of claim 1 wherein the companding transfer function is selected from the group consisting of A-law companding and $\mu$-law companding.

3. The converter of claim 1 wherein the switching circuitry further comprises:
   a first scaling capacitor having first and second terminals, the first terminal of the first scaling capacitor coupled to the first node, the second terminal of the first scaling capacitor coupled to a third node; and
   decoding circuitry for switching the voltage at the third node to a selected one of the capacitors of the second capacitor array.

4. A multi-mode digital to analog converter comprising:
   a first capacitor array for generating a first voltage at a first node, each capacitor in the array having a first and second terminal, each of its first terminals coupled to the first node;

a second capacitor array for generating a second voltage at a second node, each capacitor in the array having a first and second terminal, each of its first terminals coupled to the second node;

a first scaling capacitor having first and second terminals, its terminal coupled to the first node and the s terminal coupled to a third node;

switching circuitry for accepting a set of inputs, for coupling the second terminal of each of the capacitors of the first array to one of a first set of voltage levels, and for coupling the second terminal of each of the capacitors of the second array to one of a second set of voltage levels including a voltage at the third node, the switching circuitry responsive to the set of digital inputs, one of the set of inputs representative of a selected transfer function, the transfer function selected from the group consisting of linear and companding; and a buffer for outputting the voltage on the second node.

5. The converter of claim 4 wherein the companding transfer function is selected from the group consisting of A-law companding and $\mu$-law companding.

6. A method for generating an analog voltage at an output node representative of a digital input and a selected transfer function comprising the steps of:

generating a first voltage at a first node, the first node coupled to each of a first terminal of a first array of capacitors, each of a second terminal of the first array of capacitors selectively coupled to one of a first set of voltage levels the selected one of the first set of voltage levels responsive to the digital input; and generating a second voltage at the output node, the output node coupled to each of a first terminal of a second array of capacitors, each of a second terminal of the second array of capacitors selectively coupled to one of a second set of voltage levels including a voltage at a third node, the third node coupled to the first node through a scaling capacitor, the selected one of the second set of voltage levels responsive to the digital input and to the transfer function, the transfer function selected from the group consisting of linear and companding.

7. The method of claim 6 wherein the step of generating a second voltage further comprises the step of coupling the selected voltage of the second set of voltage responsive to a transfer function selected from the group consisting of linear, A-law companding and $\mu$-law companding.

* * * * *